United States Patent
Bansal et al.

(10) Patent No.: US 11,101,207 B2
(45) Date of Patent: Aug. 24, 2021

(54) INTEGRATED CIRCUIT WITH CELLS HAVING METAL LAYER CONFIGURED BASED ON DIRECTIONS FROM WHICH INTERCELL METAL INTERCONNECTS CONNECTS TO THE METAL LAYER

(71) Applicant: QUALCOMM Incorporated, San Diego, CA (US)

(72) Inventors: Mamta Bansal, San Diego, CA (US); Vincent Xavier Le Bars, Poway, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/667,021

(22) Filed: Oct. 29, 2019

(65) Prior Publication Data

US 2021/0125917 A1 Apr. 29, 2021

(51) Int. Cl.
*H01L 23/522* (2006.01)
*H01L 27/02* (2006.01)
*H01L 23/528* (2006.01)
*G06F 30/392* (2020.01)
*G06F 30/394* (2020.01)

(52) U.S. Cl.
CPC ........ *H01L 23/5221* (2013.01); *G06F 30/392* (2020.01); *G06F 30/394* (2020.01); *H01L 23/528* (2013.01); *H01L 27/0207* (2013.01)

(58) Field of Classification Search
CPC ............. H01L 23/5221; H01L 27/0207; H01L 23/528; G06F 30/392; G06F 30/394
See application file for complete search history.

(56) References Cited

U.S. PATENT DOCUMENTS

| | | | |
|---|---|---|---|
| 6,121,644 A * | 9/2000 | Tsujihashi | H01L 23/528 257/207 |
| 2010/0155783 A1* | 6/2010 | Law | H01L 27/0207 257/206 |
| 2015/0370950 A1* | 12/2015 | Kawa | H01L 21/823871 716/119 |
| 2019/0312023 A1* | 10/2019 | Morrow | H01L 29/4175 |

* cited by examiner

*Primary Examiner* — Stephen W Smoot
*Assistant Examiner* — Vicki B. Booker
(74) *Attorney, Agent, or Firm* — Chui-Kiu Teresa Wong (57) ABSTRACT

An integrated circuit (IC), including a first integrated circuit (IC) cell configured to perform a defined operation on a first input signal to generate a first output signal, wherein the first IC cell includes a first metal configured to receive the first input signal or output the first output signal; and a second IC cell configured to perform the defined operation on a second input signal to generate a second output signal, wherein the second IC cell includes a second metal configured to receive the second input signal or the second output signal, wherein the second metal is located substantially in the same location within the second IC cell as the first metal is located within the first IC cell, and wherein the first and second metals are configured differently based on differences in first and second intercell metal interconnects to which the first and second metals electrically connect, respectively.

21 Claims, 8 Drawing Sheets

INTEGRATED CIRCUIT WITH CELLS HAVING METAL LAYER CONFIGURED BASED ON DIRECTIONS FROM WHICH INTERCELL METAL INTERCONNECTS CONNECTS TO THE METAL LAYER

FIELD

Aspects of the present disclosure relate generally to integrated circuits (ICs), and in particular, to an integrated circuit with the same functional IC cells with corresponding metal layer configured differently based on different longitudinal directions from which intercell metal interconnects extends to or from the IC cells.

DESCRIPTION OF RELATED ART

Metallization in an integrated circuit (IC) cell is needed to route signals to and from active devices of the cell. However, unnecessary or too much metallization in an IC cell often has adverse effects on various parameters, such as maximum operating frequency, timing, signal crosstalk, power consumption, and IC footprint.

Often IC cells are designed to include more metallization than needed to allow a place and route (PR) tool to more easily route intercell metal interconnects to a cell by allowing various access locations inside the cell at which to connect the intercell metal interconnect. This feature of facilitating the routing of intercell metal interconnects typically results in the IC cell having unnecessary or too much metal.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an integrated circuit (IC) including a first IC cell configured to perform a defined operation on a first input signal to generate a first output signal, wherein the first IC cell includes a first metal layer configured to receive the first input signal or output the first output signal; and a second IC cell configured to perform the defined operation on a second input signal or to generate a second output signal, wherein the second IC cell includes a second metal layer configured to receive the second input signal or output the second output signal, wherein the second metal layer is located substantially in the same location within the second IC cell as the first metal layer is located within the first IC cell, wherein first and second metals layers are configured differently based on differences in first and second intercell metal interconnects to which the first and second metal layers electrically connect, respectively.

Another aspect of the disclosure relates to an integrated circuit (IC) including a set of IC cells configured to perform same operations on a set of input signals, respectively, wherein the set of IC cells include a set of metal layers configured to receive the set of input signals from a set of intercell metal interconnects, respectively, wherein the set of metal layers are configured differently based on different longitudinal directions from which the set of intercell metal interconnects extends from the set of IC cells, respectively.

Another aspect of the disclosure relates to an integrated circuit (IC) including a first IC cell configured to perform a defined operation on a first input signal to generate a first output signal, wherein the first IC cell includes a first input metal layer configured to receive the first input signal from a first intercell interconnect and a first output metal layer configured to output the first output signal to a second intercell interconnect; and a second IC cell configured to perform the same defined operation on a second input signal to generate a second output signal, wherein the second IC cell includes a second input metal layer configured to receive the second input signal from a third intercell interconnect and a second output metal layer configured to output the second output signal to a fourth intercell interconnect; wherein a layout of the first IC cell is substantially the same as a layout of the second IC cell with an exception that the first input metal layer is configured differently within the first IC cell than the second input metal layer is configured within the second IC cell, or the first output metal layer is configured differently within the first IC cell than the second output metal layer is configured within the second IC cell.

Another aspect of the disclosure relates to a method of designing an integrated circuit (IC). The method includes forming a layout representation of an IC cell, wherein the layout representation of the IC cell includes one or more virtual locations; instantiating the layout representation of the IC cell in a layout for the IC; and forming layout representation of one or more intercell routing interconnects having ends terminating at the one or more virtual locations, respectively.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Standard integrated circuit (IC) cells are the building blocks of any digital IC ("chip") or system-on-chip (SOC). The way the standard cells are presented to a place and route (PR) tool is through an abstracted representation called an abstract view or library exchange format (LEF) (e.g., LEF is an industry standard for abstracted cell layout). The abstract view includes pin locations and metal types, as well as metal and via keep-outs, called obstructions. The PR tool has to route metal interconnects and vias to cell metal pins and avoid obstructions.

The design of standard cells has been very similar for the past several years, basically driven by height reduction, routability, and reduce power consumption. The improvements in terms of performance (e.g., maximum operating frequency), IC area, and power consumption have been mainly achieved due to both improvement in devices inside the cell, such as field effect transistors (FETs) (e.g., n-channel metal oxide semiconductor (NMOS) FETs, p-channel metal oxide semiconductor (PMOS) FETs, FINFETs, etc.), and design rules from IC foundries allowing for smaller dimensions in metal layers and vias.

It may be said that the manner in which metal pins have been previously provided to metal layers M1, M2 or M3 has been very sub-optimal in terms of performance. For example, every metal interconnect and via added inside an IC cell has to honor complex design rules, usually resulting in more metal inside a cell than needed (e.g., the metal minimum area rules are a good example of this). Besides, metal pins are typically extended as much as possible to allow for better access by a PR tool. Any unneeded metal extension translates into reduced performance for the IC cell. This is further explained with reference to the following example.

Figure 1:
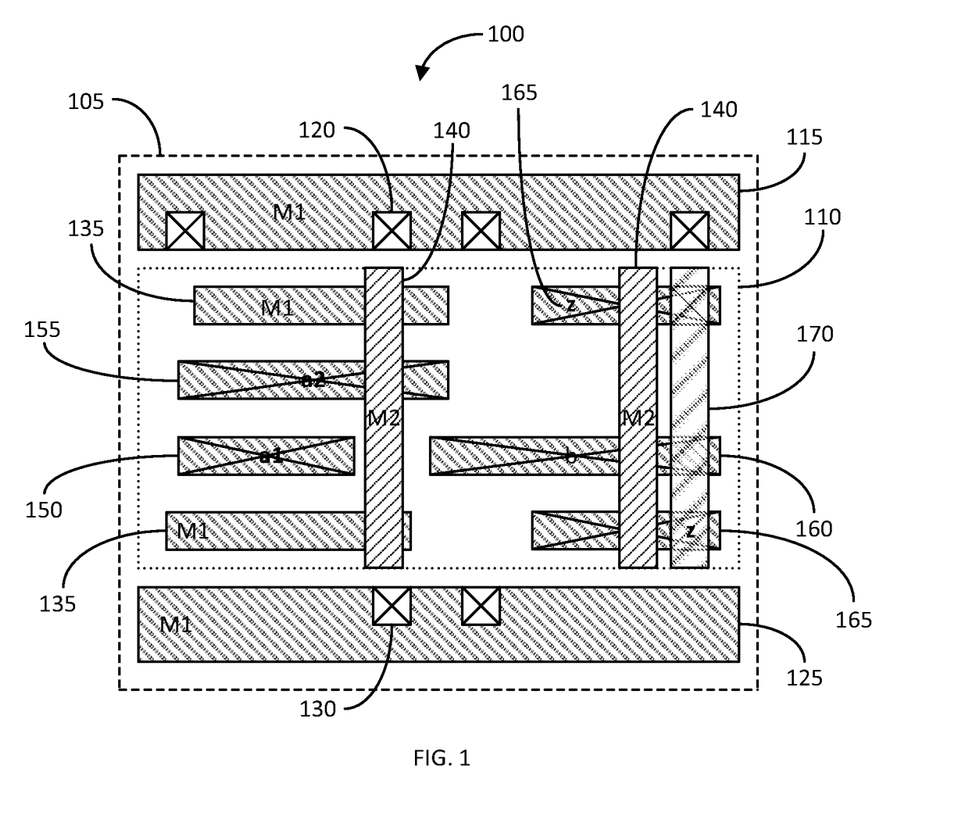
FIG. 1 illustrates a top view of an abstract view representation of an exemplary integrated circuit (IC) cell in accordance with an aspect of the disclosure.

FIG. 1 illustrates a top view of an exemplary integrated circuit (IC) cell 100 in accordance with an aspect of the disclosure. In this example, the IC cell 100 is a single-row-height cell with a boundary 105 having a height (vertical dimension as shown) of a single row and a width (horizontal dimension as shown) as desired per the functional requirements of the cell. The IC cell 100 includes a pair of power or voltage metallization rails 115 and 125 (e.g., Vdd and ground) at metal layer M1 (e.g., lowest metal layer closest to the semiconductor substrate among a set of stacked metal layers, although there may be local interconnects situated between M1 layer and the substrate), with respective sets of contacts 120 and 130, situated near the top and bottom of the cell. The IC cell 100 further includes one or more active or diffusion regions 110 (e.g., p-dopant and n-dopant diffusion regions separated by a shallow trench isolation (STI) in the case of FINFETs) formed within and/or upon the substrate, and situated between the power rails 115 and 125. One or more devices, such as the FETs discussed above, are implemented in and upon the one or more active or diffusion regions 110, and receive power (e.g., voltage and current) via the power rails 115 and 125.

The IC cell 100 further includes various intracell (within the cell) metal interconnects 135 implemented in metal layer M1 for making direct electrical contact to terminals of one or more devices of the cell 100 by way of vias (e.g., metal vias V0), and various intracell metal bridge 140 implemented in metal layer M2 making electrical contacts to the metal interconnects 135 via metal vias (e.g., metal vias V1). The IC cell 100 further includes a set of metal pins 150, 155, 160, and 165 (represented by metal strips with Xs superimposed). The metal pins 150, 155, and 160 are further labeled as "a1", "a2", and "b", respectively; which, in this example, may be inputs to a logic gate (e.g., AND) or digital operation performed by the IC cell 100. The metal pin 165 is labeled "z", which, in this example, is an output of the logic gate or digital operation performed by the IC cell 100.

As illustrated, the metal pins 150, 155, and 160 are extended or made to have significantly large area than needed to provide a PR tool with several access locations to facilitate the intercell routing (cell-to-cell) performed by the PR tool. For example, the length of input metal pin 150 ("a1") is made long enough to provide two or more access locations for the PR tool. Similarly, the lengths of input metal pins 155 ("a2") and 160 ("b") are also made long enough to provide multiple access locations for the PR tool. Furthermore, the output metal pin 165 ("z") has multiple locations inside of the IC cell 100 that needs to be electrically connected to each other by way of a predefined metal bridge 170 (e.g., M2) and associated metal vias (e.g., V1).

As a result of providing predefined metal pins with multiple access locations and predefined metal bridges, the IC cell 100, when instantiated into a physical IC cell, typically has more metallization than needed. Generally, the extra unneeded metallization has adverse effects on circuit performance and power consumption. For example, the additional metallization introduces more parasitic capacitance, which has a negative effect on maximum operating frequency and timing. The parasitic capacitance also increases the load current; thereby, resulting in additional power consumption. Predefined metal bridges may not optimal in reducing signal crosstalk between lines.

Figure 2A:
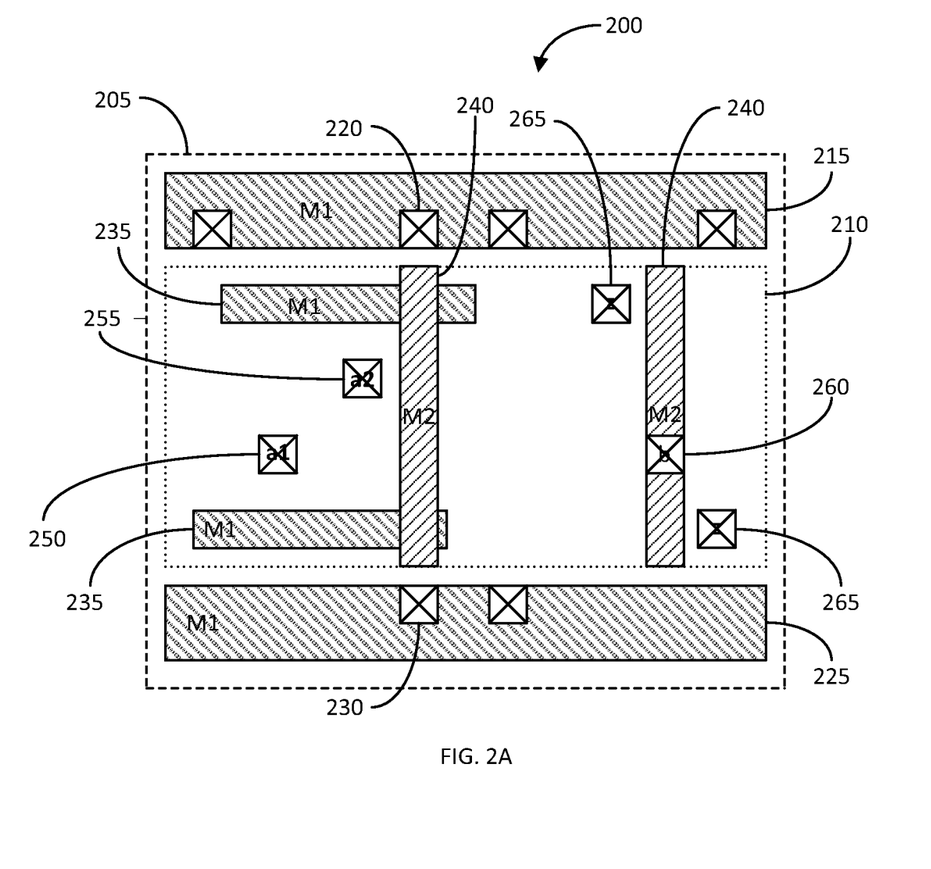
FIG. 2A illustrates a top view of an abstract view representation of another exemplary integrated circuit (IC) cell in accordance with another aspect of the disclosure.

FIG. 2A illustrates a top view of an abstract view or layout representation (e.g., LEF) of another exemplary integrated circuit (IC) cell 200 in accordance with another aspect of the disclosure. In summary, in the abstract view of the IC cell 200, all metal pins are removed and replaced with hit points, respectively. A hit point is a virtual input/output (I/O) location of an IC cell to which a PR tool may route an intercell metal interconnect for electrically coupling another IC cell to the IC cell 200.

The hit points may be positioned closest to the respective terminals (e.g., source, gate, drain, etc.) of the active devices to which they need to be connected. Accordingly, the PR tool only forms metal layers proximate the hit points and configures the metal layers based on the intracell metal interconnects that terminate at the metal layers; thereby, reducing the unneeded metallization that existed in IC cell 100, as previously discussed. Further, in this example, metal bridges used in IC cells may not be provided in the abstract view of IC cell 200 to allow the PR tool to implement metal bridges so as to reduce cell metallization, congestion, and crosstalk.

In particular, the IC cell 200 is a single-row-height cell with a boundary 205 having a height (vertical dimension as shown) of a single row and a width (horizontal dimension as shown) as desired per the functional requirements of the cell. The IC cell 200 includes a pair of power or voltage metallization rails 215 and 225 (e.g., Vdd and ground) at metal layer M1, with respective sets of contacts 220 and 230, situated near the top and bottom of the cell. The IC cell 200 further includes one or more active or diffusion regions 210 formed within and/or upon a semiconductor substrate, and situated between the power rails 215 and 225. One or more devices, such as the FETs discussed above, are implemented in and upon the one or more active or diffusion regions 210, and receive power (e.g., voltage and current) via the power rails 215 and 225.

The IC cell 200 further includes various intracell metal interconnects 235 implemented in metallization layer M1 making direct electrical contact to one or more devices of the cell 200 via the lowest metal vias (e.g., V0), and various intracell metal bridge 240 implemented in metal layer M2 making electrical contacts to the metal interconnects 235 via metal vias (e.g., V1).

The abstract view of IC cell 200 further includes a set of hit points 250, 255, 260, and 265 (each represented by a box with an X superimposed). The hit points 250, 255, and 260 are further labeled as "a1", "a2", and "b", respectively; which, in this example, may be the hit points closest to device terminals serving as inputs to a logic gate (e.g., AND) or digital operation performed by the IC cell 200. The hit point 265 is labeled "z", which, in this example, may be the hit point closest to device terminals serving as an output of the logic gate or digital operation performed by the IC cell 200. Each hit point is a place holder or cell location to which a PR tool may terminate an intercell metal interconnect and/or an intracell metal bridge.

Because a hit point provides a place holder or location to which an end of an interconnect may be terminated, no extra metal is needed to provide optional access locations to a metal pin that may be used by a PR tool. Accordingly, the IC cell 200, when instantiated into a physical IC cell, will generally include less metallization than one instantiated from IC cell 100, which includes pre-positioned, oversized metal pins. The less metallization in the instantiated IC cell 200 translates to improved performance in terms of maximum operating frequency, timing, crosstalk, and reduced power consumption.

Figure 2B:
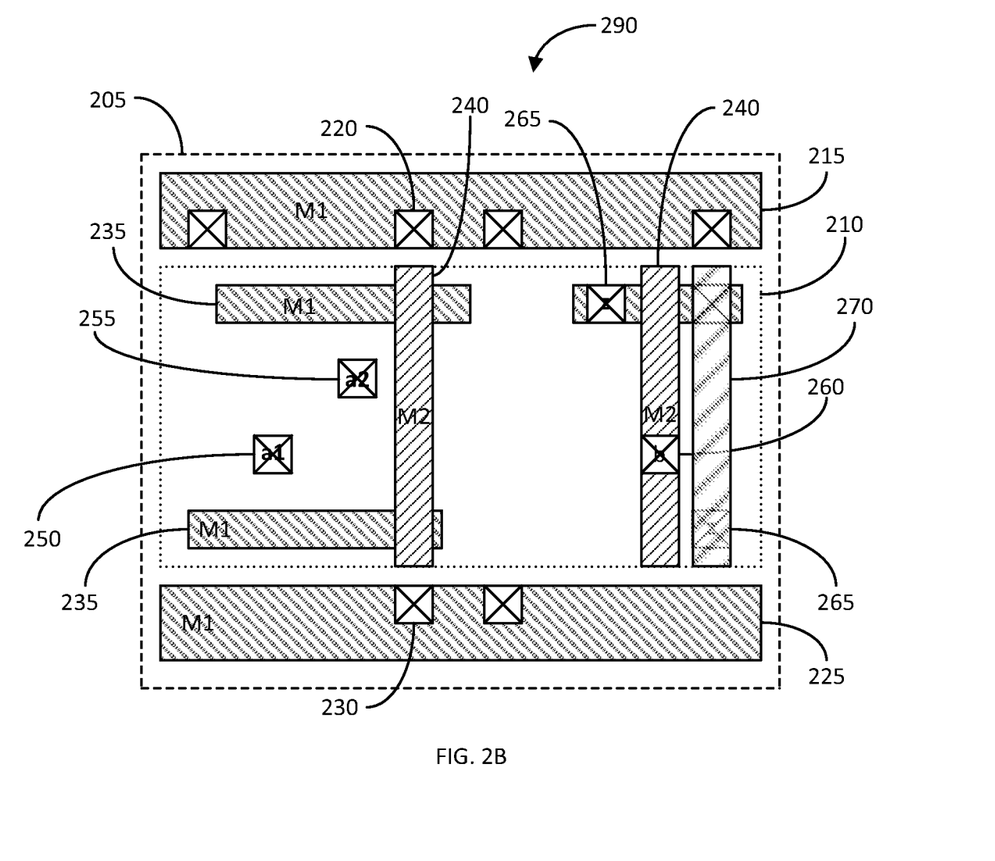
FIG. 2B illustrates a top view of an abstract view representation of another exemplary integrated circuit (IC) cell in accordance with another aspect of the disclosure.

FIG. 2B illustrates a top view of an abstract view or layout representation (e.g., LEF) of an exemplary integrated circuit (IC) cell 290 in accordance with another aspect of the disclosure. The IC cell 290 is similar to IC cell 200 but includes an intracell metal bridge 270 electrically connecting together the hit points 265 ("z"). Thus, in such case, a PR tool may generate intercell metal interconnects terminating at the hit points 250 ("a1"), 255 ("a2"), 260 ("b"), and 265 ("z"). As the IC cell 290 already has the required intracell metal bridge 270, the PR tool need not implement it during the routing operation. The following describes various examples illustrating how IC cells may be instantiated from the abstract view of IC cells with hit points instead of predefined metal pins.

Figure 3:
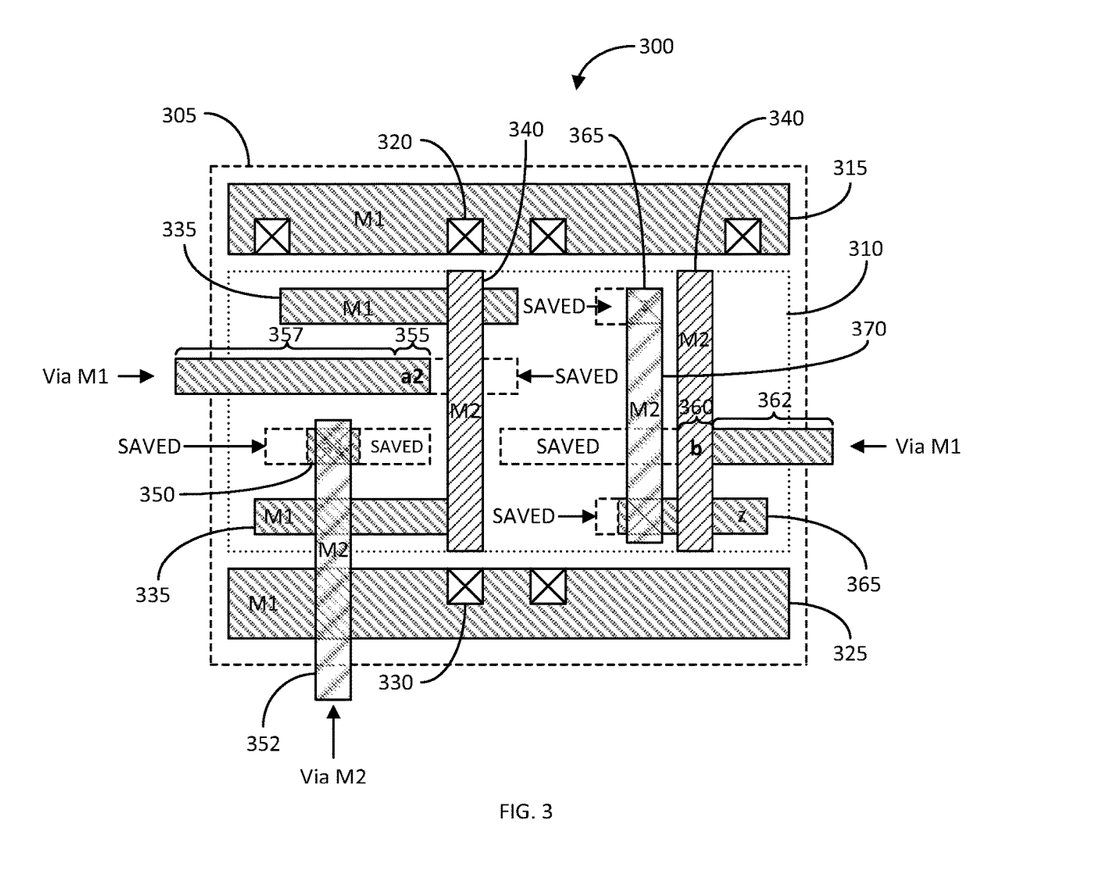
FIG. 3 illustrates a top view of an exemplary integrated circuit (IC) cell in accordance with another aspect of the disclosure.

FIG. 3 illustrates a top view of another exemplary IC cell 300 in accordance with another aspect of the disclosure. The IC cell 300 is an example of an instantiation of the abstract view of IC cell 200. In this example, intercell routing to input metal layers instantiated from hit points 250 ("a1") and 255 ("a2") is coming from below and left of the IC cell 300. Intercell routing to input metal layer instantiated from hit point 260 ("b") is coming from the right of the IC cell 300. And, intercell routing from output metal layer instantiated from hit points 265 ("z") is routed to below the IC cell 300.

As a result of the different intercell routing directions, a PR tool may have configured the IC cell 300 to have metal layers configured based on the routing directions. For example, the IC cell 300 has a metal layer 350 proximate the hit point or virtual location 250 ("a1") for a signal input to a digital or analog operation performed by the cell that extends horizontally on either side of hit point 250 or virtual location ("a1") sufficient (in accordance with foundry rules) to make electrical contact to an (e.g., M2) intercell metal interconnect 352 by way of a via (e.g., V1); the intercell metal interconnect 352 extending below the IC cell 300. The metal layer 350 serves as an end of the intercell metal interconnect 352.

The IC cell 300 has another metal layer 355 proximate the hit point or virtual location 255 ("a2") for another signal input to the digital or analog operation performed by the cell that connects to an intercell routing interconnect 357 that extends along metal layer M1 from the metal 355 towards the left of the IC cell 300. The metal layer 355 serves as an end of the intercell metal interconnect 357.

Similarly, the IC cell 300 has a metal layer 360 proximate the hit point or virtual location 260 ("b") for yet another signal input to the digital or analog operation performed by the cell that connects to an intercell routing interconnect 362 that extends along metal layer M1 from the metal layer 360 towards the right of the IC cell 300. The metal layer 360 serves as an end of the intercell routing interconnect 362.

Further, based on a routing direction in the downward vertical direction as shown, a PR tool may have configured the IC cell 300 to have a metal layer 365 for a signal output of the digital or analog operation performed by the cell that has a metal bridge 370 and associated metal vias to the left of another metal bridge 340 for intracell connections. The PR tool may have configured the metal bridge 370 to be on the left of metal bridge 340 to prevent or reduce signal crosstalk between the input metal layer 360 ("b") and the output metal layer 365 ("z").

The remaining elements of the IC cell 300 may be the same as the remaining elements of the abstract view of IC cell 200. For example, the IC cell 300 may be a single-row-height cell with a boundary 305 having a height (vertical dimension as shown) of a single row and a width (horizontal dimension as shown) as desired per the functional requirements of the cell. The IC cell 300 includes a pair of power or voltage metallization rails 315 and 325 (e.g., Vdd and ground) at metal layer M1, with respective sets of contacts 320 and 330, situated near the top and bottom of the cell. The IC cell 300 further includes one or more active or diffusion regions 310 formed within and/or upon a semiconductor substrate, and situated between the power rails 315 and 325. One or more devices, such as the FETs discussed above, are implemented in and upon the active or diffusion region 310, and receive power (e.g., voltage and current) via the power rails 315 and 325. The IC cell 200 further includes various intracell metal interconnects 335 implemented in metallization layer M1 making electrical contact (e.g., by way of the lowest via "V0") to one or more devices of the cell 300, and various intracell metal bridge 340 implemented in metal layer M2 making electrical contacts to the metal interconnects 335 by way of metal vias (e.g., using metal vias V1).

By using hit points, the amount of metallization in IC cell 300 is substantially less than IC cell 100, which uses predefined metal pins. For example, with regard to metal layer 350 of IC cell 300, there is a substantial metal savings (labeled as "SAVED" in FIG. 3) compared to that of a metal layer corresponding to metal pin 150 of instantiated IC cell 100. Since the intercell routing interconnect 352 to metal layer 350 is coming from below the IC cell 300, significant metallization to the right or the left of hit point 250, as in metal pin 150, is not needed. Similarly, with regard to metal layer 355 of IC cell 300, there is also substantial metal savings ("SAVED") compared to that of a metal layer corresponding to metal pin 155 of instantiated IC cell 100. Since the intercell routing interconnect 357 to metal layer 355 is coming from the left of the IC cell 300, the metallization to the right of hit point 255, as in metal pin 150, is not needed.

Similarly, with regard to metal layer 360 of IC cell 300, there is also substantial metal savings ("SAVED") compared to that of a metal layer corresponding to metal pin 160 of instantiated IC cell 100. Since the intercell routing interconnect 362 to metal layer 360 is coming from the right of the IC cell 300, the metallization to the left of hit point 260, as in metal pin 160, is not needed. With regard to the output metal layer 365, as discussed, the PR tool may have set up the metal layer 365 to include the metal bridge 370 on the left of metal bridge 340 to reduce crosstalk between the signal on metal layer 360 and the signal on metal layer 365. The PR tool may have also included the metal bridge 370 at the position shown for better intercell routability, as in the case, where the intercell routing from the metal layer 365 of IC cell 300 extends vertically upward from the cell as shown; with some metallization savings at the upper and lower portion of the metal layer 365.

The end result of using hit points instead of predefined metal pins is that IC cell 300 has substantially less metallization inside the cell. This is illustrated with all the areas of the IC cell 300 labeled "SAVED". The less metallization in an IC cell translates into less parasitic capacitance, which may lead to higher maximum operating frequency, less issues with timing, less signal crosstalk, and improved power efficiency.

Figure 4:
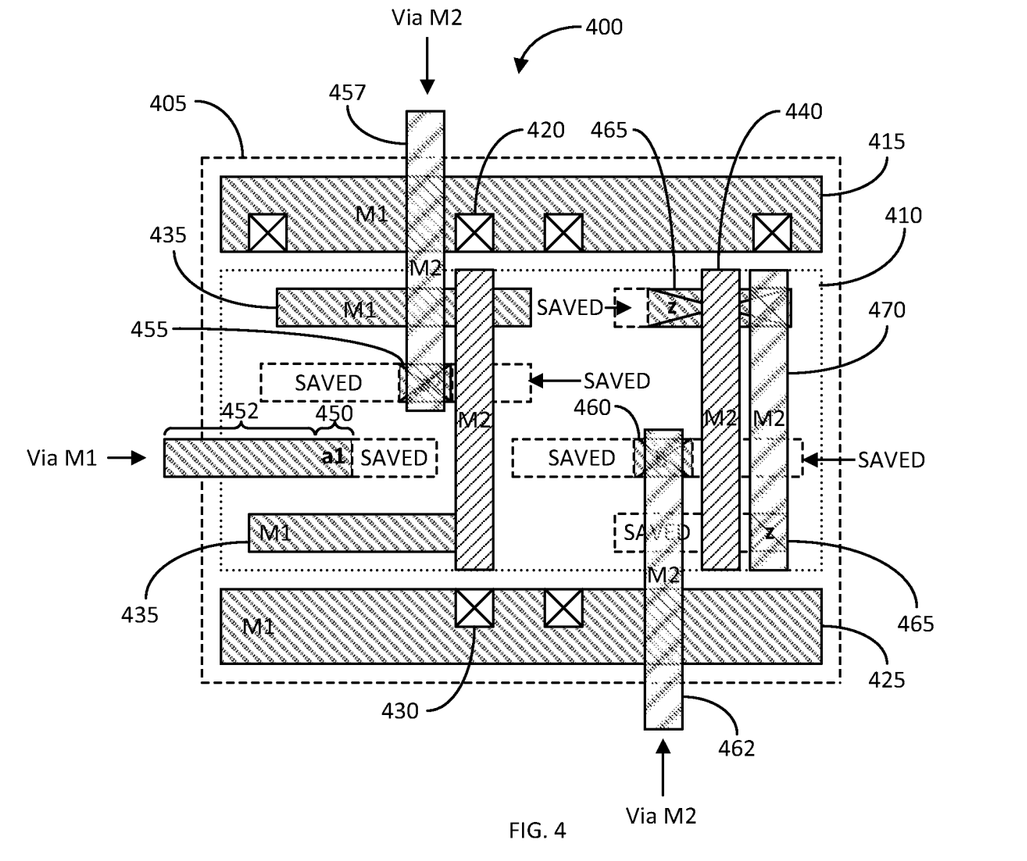
FIG. 4 illustrates a top view of another exemplary integrated circuit (IC) cell in accordance with another aspect of the disclosure.

FIG. 4 illustrates a top view of another example of an integrated circuit (IC) cell 400 instantiated from IC cell 200 or 290 in accordance with another aspect of the disclosure. In this example, intercell routing to input metal layers instantiated to hit points 250 ("a1") and 255 ("a2") is coming from the left and above of the IC cell 400, respectively. Intercell routing to input metal layer instantiated from hit point 260 ("b") is coming from below the IC cell 400. And, intercell routing from metal layer instantiated from hit points 265 ("z") is routed to the right of the IC cell 400.

As a result of the different intercell routing directions, a PR tool may have configured the IC cell 400 to have metal layers configured based on the routing directions. For example, the IC cell 400 has metal layer 450 for a signal input to a digital or analog operation performed by the cell that connects to an intercell routing interconnect 452 that extends along metal layer M1 from the metal 450 towards the left of the IC cell 400. The metal layer 450 serves as an end of the intercell metal interconnect 452.

The IC cell 400 has another metal layer 455 for another signal input to the digital or analog operation performed by the cell that extends horizontally on either side of hit point 255 ("a2") sufficient (in accordance with foundry rules) to make electrical contact to an (e.g., M2) intercell metal interconnect 457 by way of a via (e.g., V1). The metal layer 455 serves as an end of the intercell metal interconnect 457.

Similarly, the IC cell 400 has a metal layer 460 for yet another signal input to the digital or analog operation of the cell that horizontally extends on either side of hit point 260 ("b") sufficient (in accordance with foundry rules) to make electrical contact to an (e.g., M2) intercell metal interconnect 462 by way of a via (e.g., V1). The metal layer 460 serves as an end of the intercell metal interconnect 462.

Further, based on a routing direction in the rightward direction as shown, a PR tool may have configured the IC cell 400 to have metal layer 465 for a signal output of the digital or analog operation performed by the cell that has a metal bridge 470 and associated metal vias to the right of another metal bridge 440 for intracell connections. Or, as in the case of the abstract view of IC cell 290, the metal bridge 470 and associated metal vias may have been predefined. The PR tool may have configured the metal bridge 470 to be on the right of metal bridge 440 to prevent or reduce signal crosstalk between the input metal layer 460 ("b") and the output metal layer 465 ("z").

The remaining elements of the IC cell 400 may be the same as the remaining elements of the abstract view of IC cell 200 or 290. For example, the IC cell 400 may be a single-row-height cell with a boundary 405 having a height (vertical dimension as shown) of a single row and a width (horizontal dimension as shown) as desired per the functional requirements of the cell. The IC cell 400 includes a pair of power or voltage metallization rails 415 and 425 (e.g., Vdd and ground) at metal layer M1, with respective sets of contacts 420 and 430, situated near the top and bottom of the cell. The IC cell 400 further includes one or more active or diffusion regions 410 formed within and/or upon a substrate, and situated between the power rails 415 and 425. One or more devices, such as the FETs discussed above, are implemented in and upon the one or more active or diffusion regions 410, and receive power (e.g., voltage and current) via the power rails 415 and 425. The IC cell 400 further includes various intracell metal interconnects 435 implemented in metallization layer M1 making electrical contact (e.g., by way of the lowest via V0) to one or more devices of the cell 400, and intracell metal bridge 440 implemented in metal layer M2 making electrical contacts to the metal interconnects 435 by way of metal vias (e.g., V1).

Again, by using hit points, the amount of metallization in IC cell 400 is substantially less than IC cell 100, which uses predefined metal pins. For example, with regard to metal layer 450 of IC cell 400, there is a substantial metal savings ("SAVED") compared to that of a metal layer corresponding to metal pin 150 of instantiated IC cell 100. Since the intercell routing to metal layer 450 is coming from the left of the IC cell 400, the metallization to the right of hit point 250, as in metal pin 150, is not needed. Similarly, with regard to metal layer 455 of IC cell 400, there is also substantial metal savings ("SAVED") compared to that of a metal layer corresponding to metal pin 155 of instantiated IC cell 100. Since the intercell routing to metal 455 is coming from above the IC cell 400, significant metallization to the left or the right of hit point 255, as in metal pin 150, is not needed.

Similarly, with regard to metal layer 460 of IC cell 400, there is also substantial metal savings ("SAVED") compared to that of a metal layer corresponding to metal pin 160 of instantiated IC cell 100. Since the intercell routing to metal layer 460 is coming from below, significant metallization to the left or the right of hit point 260, as in metal pin 160, is not needed. With regard to the output metal layer 465, as discussed, the PR tool may have set up the metal layer 465 to include the metal bridge 470 on the right of metal bridge 440 to reduce crosstalk between the signal on metal 465 and the signal on metal 460. The PR tool may have also included the metal bridge 470 at the position shown for better intercell routability, as in the case, where the intercell routing from the metal layer 465 of IC cell 400 extends rightward from the cell as shown; with some metallization savings at the upper and lower portions of the metal layer 465 as shown. Also, has discussed, the metal bridge 470 may have been predefined, as in the case of abstract view of IC cell 290.

Similar to IC cell 300, the end result of using hit points instead of predefined metal pins is that IC cell 400 includes substantially less metallization than instantiated IC cell 100. This is illustrated with all the areas of the IC cell 400 labeled "SAVED". Again, the less metallization in an IC cell translates into less parasitic capacitance, which may lead to higher maximum operating frequency, less issues with timing, less signal crosstalk, and improved power efficiency.

Figure 5:
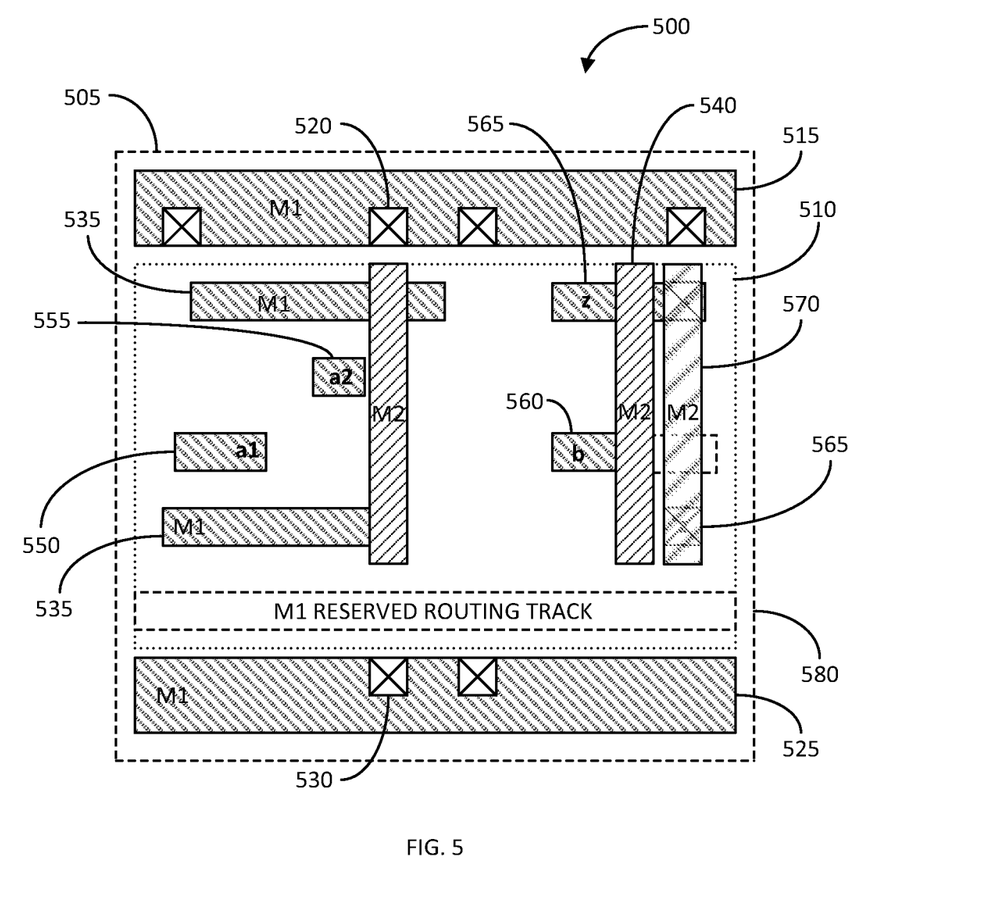
FIG. 5 illustrates a top view of another exemplary integrated circuit (IC) cell in accordance with another aspect of the disclosure.

FIG. 5 illustrates a top view of another exemplary integrated circuit (IC) cell 500 in accordance with another aspect of the disclosure. The IC cell 500 is a variation of IC cell 400 previously discussed in detail, and includes many of the same elements as indicated by the same reference numbers with the exception that the most significant digit (MSD) is a "5" in the case of IC cell 500.

That is, the IC cell 500 may be sized to include a boundary 505 with a single- or multiple-row-height, and a width as required by the design; a pair of power metallization rails 515 and 525 with respective contacts 520 and 530; one or more active or diffusion regions 510 including one or more active devices (e.g., FETs); intracell metallization 535 electrically connected to the one or more active devices by way of metal vias (e.g., lowest metal via V0); intracell metal bridges 540; and various metal layers 550 ("a1"), 555 ("a2"), 560 ("b"), and 565 ("z") including metal bridge 570, as previously discussed in detail.

The IC cell 500 further includes a reserved M1 (or other lower layer used for intracell connections) routing track 580 extending longitudinally (horizontally) the entire width of the cell. As it is customary in IC layout to place equal-height IC cells in the same row, a PR tool may use the M1 reserved routing track 580 to provide intercell metal interconnects. As the intercell metal interconnects extend entirely by way of a lower metallization layer, such as M1, to effectuate the intercell metal connections, using higher metallization layers with associated high-resistive metal vias to effectuate the same intercell metal connections may be avoided.

These intercell metal interconnects with higher metallization layers and associated metal vias typically have high resistance, which have adverse effects on maximum operating frequency, timing, power consumption, and typically require relatively large amounts of IC footprint to implement because of the need for multi-layer use. The multi-layer intercell metal interconnects also generally produce more routing congestion, which may further result in higher signal crosstalk between signal lines. Accordingly, the M1 reserved routing track 580 should alleviate the aforementioned drawbacks associated with multi-layer intercell metal interconnects. Although, in this example, the IC cell 500 includes one (1) M1 reserved routing track 580, it shall be understood that the IC cell may be configured to include more than one reserved routing track.

Figure 6:
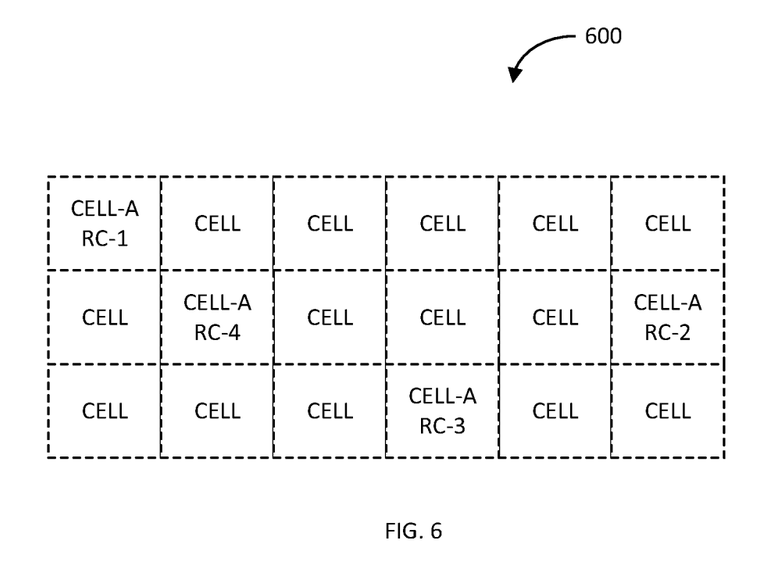
FIG. 6 illustrates a top view of another exemplary integrated circuit (IC) including an array of IC cells in accordance with another aspect of the disclosure.

FIG. 6 illustrates a top view of another exemplary integrated circuit (IC) including an array of IC cells 600 in accordance with another aspect of the disclosure. In this example, the array 600 includes three (3) rows, each row including six (6) IC cells. Further, in accordance with this example, the array 600 includes four (4) identical IC cells A with different routing configurations (RCs): Cell-A RC-1, Cell-A RC-2, Cell-A RC-3, and Cell-A RC-4. Cell-A RC-1 is located in the top row, first cell on the left; Cell-A RC-2 is located in the middle row, first cell on the right; Cell-A RC-3 is located in the bottom row, fourth cell from the left; and Cell-A RC-4 is located in the middle row, second cell on the left.

The IC cells A are essentially the same: they perform the same operation (e.g., a three-input AND operation) and the layouts are basically the same with the exception that their routing connection may be configured differently depending on how intercell metal interconnects are routed to them.

As an example, Cell-A RC-4 may be a variation similar to IC cell 300, where the intercell metal interconnects for metal layers 350 ("a1") and 355 ("a2") are coming from the left, intercell metal interconnect for metal layer 360 ("b") is coming from the right, and intercell metal interconnects for metal layer 365 ("z") is extending downward. Cell-A RC-1 may be may be a variation similar to IC cell 400, where the intercell metal interconnects for metal layers 350 ("a1") is coming from the left, intercell metal interconnect for metal layers 355 ("a1") and 360 ("b") are coming from the right, and intercell metal interconnects for metal layer 365 ("z") is extending rightward. Cell-A RC-2 and Cell-A RC-3 may be other variations of the same cell with their respective metal layers configured differently based on directions of intercell metal interconnects to and/or from the cells.

Figure 7:
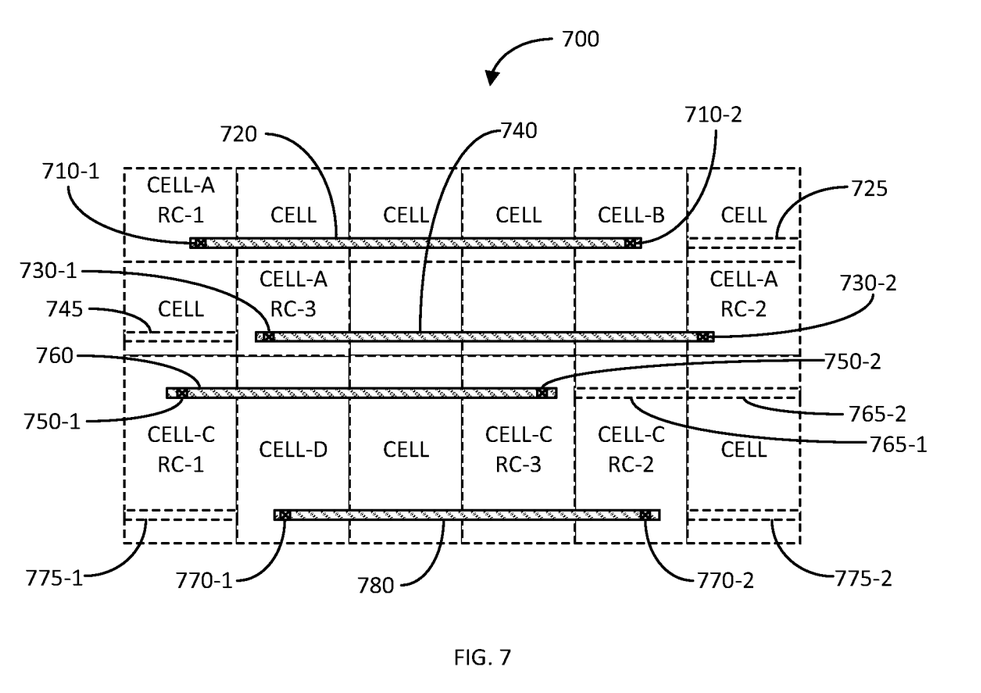
FIG. 7 illustrates a top view of another exemplary integrated circuit (IC) including an array of IC cells in accordance with another aspect of the disclosure.

FIG. 7 illustrates a top view of another exemplary integrated circuit (IC) including an array of IC cells 700 in accordance with another aspect of the disclosure. In this example, the array 700 includes three (3) rows, each row including six (6) IC cells.

Further, in accordance with this example, the array 700 includes three (3) identical IC cells with different routing connections (RCs): Cell-A RC-1, Cell-A RC-2, and Cell-A RC-3. Cell-A RC-1 is located in the top row, first cell on the left; Cell-A RC-2 is located in the middle row, first cell on the right; and Cell-A RC-3 is located in the middle row, second cell on the left. These IC cells are essentially the same: they perform the same operation (e.g., a three-input AND operation) and the layouts are basically the same with the exception that their routing connections may be configured differently depending on how intercell metal interconnects are routed to them.

The array 700 further includes other notable IC cells, such as Cell-B located on the top row, fifth cell from the left; three (3) identical cells with different routing connections (RCs): Cell-C RC-1, Cell-C RC-2, and Cell-C RC-3, all on the bottom row and first, fifth, and fourth cells from the left, respectively; and a Cell-D on the bottom row, second cell from the left. The cells in the top and middle rows are single-row-height cells, and the cells in the bottom row are double-row-height cells.

The cells in the top and middle rows have a set of longitudinally (horizontally) aligned M1 reserved routing tracks, respectively. The cells in the bottom row have two sets (upper and lower) of longitudinally (horizontally) aligned M1 reserved routing tracks, respectively. As discussed with reference to IC cell 500, a PR tool may use these M1 reserved routing tracks to provide intercell metal interconnects between different cells.

For example, the array 700 includes an intercell metal interconnect 720 extending from a metal layer 710-1 of Cell-A RC-1 to metal layer 710-2 of Cell-B via entirely the aligned M1 reserved routing tracks of those cells and the cells between them. Note that the cell at the right-end of the top row has an unused M1 reserved routing track 725 longitudinally (horizontally) aligned with the intercell metal interconnect 720.

The array 700 includes another intercell metal interconnect 740 extending from a metal layer 730-1 of Cell-A RC-3 to metal layer 730-2 of Cell-A RC-2 entirely via the aligned M1 reserved routing tracks of those cells and the cells between them. Note that the cell at the left-end of the middle row has an unused M1 reserved routing track 745 longitudinally (horizontally) aligned with the intercell metal interconnect 740.

Additionally, the array 700 includes an intercell metal interconnect 760 extending from a metal layer 750-1 of Cell-C RC-1 to metal layer 750-2 of Cell-C RC-3 entirely via the aligned M1 reserved routing tracks of those cells and the cells between them. The array 700 further includes an intercell metal interconnect 780 extending from a metal layer 770-1 of Cell-D to metal layer 750-2 of Cell-C RC-2 entirely via the aligned M1 reserved routing tracks of those cells and the cells between them. Note that the cells at opposite ends of the bottom row have unused M1 reserved routing track 775-1 and 775-2 longitudinally (horizontally) aligned with the intercell metal interconnect 780, respectively.

Figure 8:
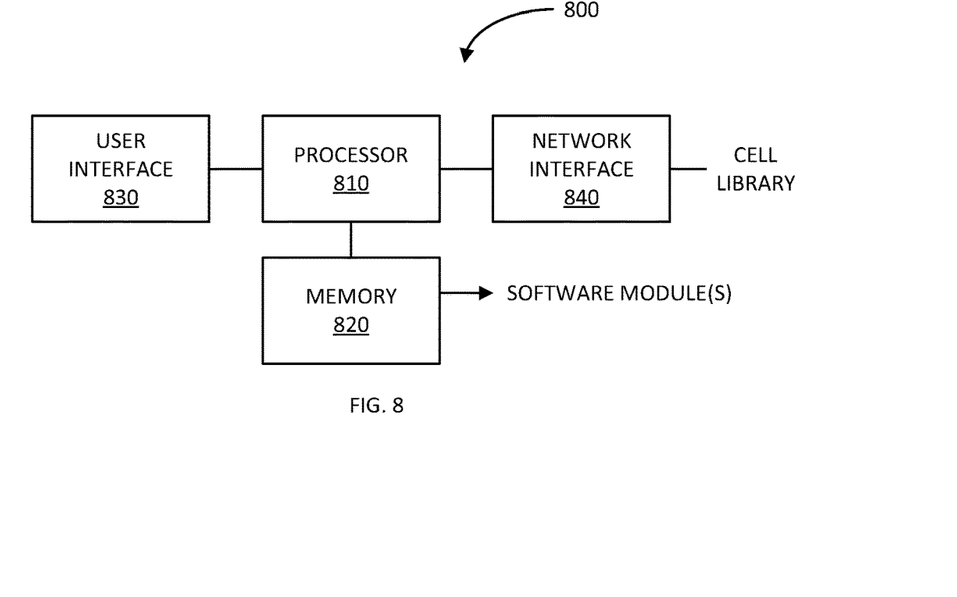
FIG. 8 illustrates a block diagram of an exemplary system for designing integrated circuits (ICs) in accordance with another aspect of the disclosure.

FIG. 8 illustrates a block diagram of an exemplary system 800 for designing integrated circuits (ICs) in accordance with another aspect of the disclosure. The system 800 may be a processor-based system. For example, the system 800 includes a processor 810 (e.g., a microprocessor), a memory 820 (e.g., random access memory (RAM), read only memory (ROM), cache memory, magnetic hard disk, solid state memory, etc. or any combination thereof) coupled to the processor 810, a user interface 830 (e.g., a display, touchscreen display, speakers, keyboard, pointing device, such as a mouse, printer, etc. or any combination thereof) coupled to the processor 820, and a network interface 840 (e.g., local area network (LAN) interface, wide area network (WAN) interface, WiFi, Ethernet, cellular cell phone, etc., or any combination thereof) coupled to the processor 820.

Under the control of a user via the user interface 930, the processor 920 may access one or more software modules configured to facilitate the design of an integrated circuit (IC). For example, the processor 920 may be configured to design or form a layout representation (e.g., LEF) of an IC cell, the IC cell including one or more hit points or virtual locations: instantiate the IC cell in a layout of the IC; and form one or more layout representations of one or more intercell metal interconnects that terminate at the one or more hit points or virtual locations of the IC cell. The processor 920 may store the IC cell and the layout of the IC in electronic files in a cell library accessible via the network interface 940. An example of a particular IC design method flow is discussed below.

Figure 9:
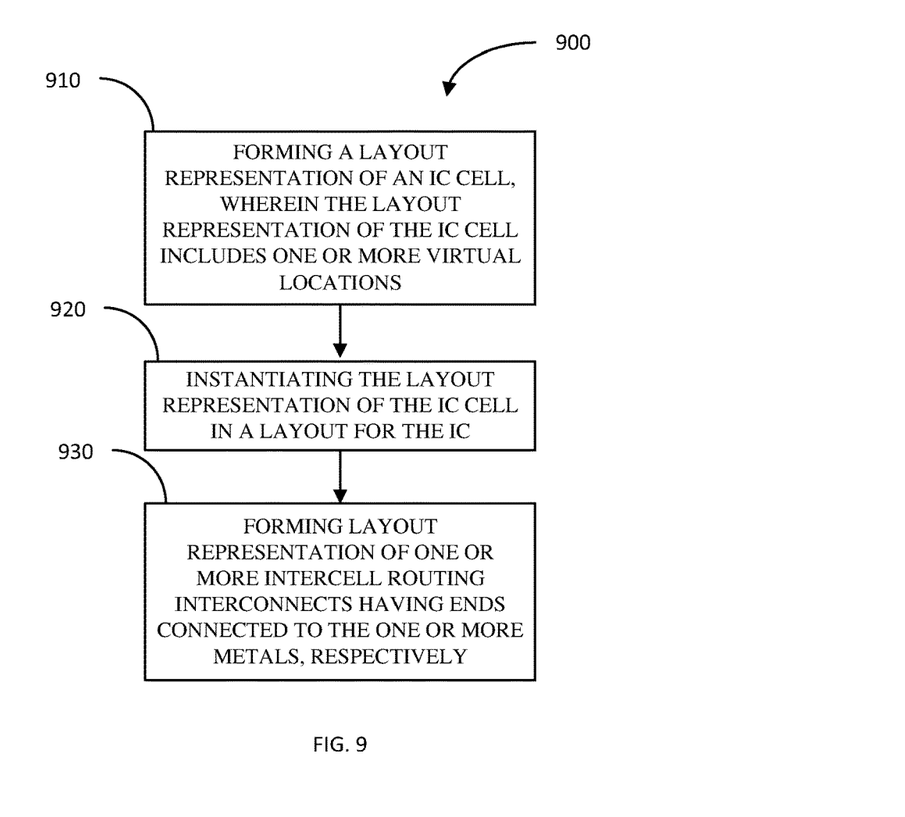
FIG. 9 illustrates a flow diagram of an exemplary method of designing an integrated circuit (IC) in accordance with another aspect of the disclosure.

FIG. 9 illustrates a flow diagram of an exemplary method 900 of designing an integrated circuit (IC) in accordance with another aspect of the disclosure. The method 900 includes forming a layout representation of an IC cell, wherein the layout representation of the IC cell includes one or more virtual locations (block 910). Examples of such layout representation of an IC cell includes layout representations of IC cells 200, 290, 300, 400, and 500 with hit points or virtual locations a1, a2, b, and z, previously discussed in detail.

The method 900 further includes instantiating the layout representation of the IC cell in a layout for the IC (block 920). Examples of instantiating the layout representation of the IC cell in a layout of an IC includes instantiating the various cells of ICs 600 and 700, previously discussed in detail.

The method 900 further includes forming layout representation of one or more intercell routing interconnects having ends terminating at the one or more virtual locations, respectively (block 930). Examples of forming layout representation of one or more intercell routing interconnects having ends terminating at the one or more virtual locations, respectively, include intercell routing interconnects 352, 357, 362, 452, 457, 462, 720, 740, 760, and 780, previously discussed in detail.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An integrated circuit, comprising:
    a first integrated circuit (IC) cell configured to perform a defined operation on a first input signal to generate a first output signal, wherein the first IC cell includes a first metal layer configured to receive the first input signal or output the first output signal; and
    a second IC cell configured to perform the defined operation on a second input signal to generate a second output signal, wherein the second IC cell includes a second metal layer configured to receive the second input signal or the second output signal, wherein the second metal layer is located substantially in the same location within the second IC cell as the first metal layer is located within the first IC cell, and wherein the first and second metal layers are configured differently based on differences in first and second intercell metal interconnects to which the first and second metal layers electrically connect, respectively.

2. The integrated circuit of claim 1, wherein the configuration of the first metal layer is based on a longitudinal direction of the first intercell metal interconnect.

3. The integrated circuit of claim 1, wherein the first metal layer is situated in a metal layer M1.

4. The integrated circuit of claim 1, wherein the first metal layer comprises a metal bridge, wherein a configuration of the metal bridge is based on the first intercell metal interconnect or other intercell metal interconnect.

5. The integrated circuit of claim 1, wherein a layout of the first IC cell is substantially the same as a layout of the second IC cell with an exception that the first metal layer is elongated more in a first direction to which the first intercell metal interconnect extends from the first metal layer, wherein the second metal layer is elongated in a second direction to which the second intercell metal interconnect extends from the second metal layer, and wherein the first direction is different than the second direction.

6. The integrated circuit of claim 1, wherein the first and second IC cells have substantially the same height.

7. The integrated circuit of claim 1, wherein the first and second IC cells are arranged in a same row.

8. The integrated circuit of claim 1, wherein the first and second IC cells comprise longitudinally aligned routing tracks at a metal layer M1.

9. The integrated circuit of claim 8, wherein at least one of the longitudinally aligned routing tracks includes a third intercell metal interconnect that extends entirely through a corresponding at least one of the first and second IC cells.

10. The integrated circuit of claim 8, wherein at least one of the longitudinally aligned routing tracks is unused.

11. The integrated circuit of claim 8, wherein at least one of the longitudinally aligned routing tracks includes a third intercell metal interconnect that terminates substantially at a metal layer inside of a corresponding one of the at least first and second IC cells.

12. An integrated circuit, comprising:
a first integrated circuit (IC) cell configured to perform a defined operation on a first input signal to generate a first output signal, wherein the first IC cell includes a first input metal layer configured to receive the first input signal from a first intercell interconnect and a first output metal layer configured to output the first output signal to a second intercell interconnect; and
a second IC cell configured to perform the defined operation on a second input signal to generate a second output signal, wherein the second IC cell includes a second input metal layer configured to receive the second input signal from a third intercell interconnect and a second output metal layer configured to output the second output signal to a fourth intercell interconnect;
wherein a layout of the first IC cell is substantially the same as a layout of the second IC cell with an exception that the first input metal layer is configured differently within the first IC cell than the second input metal layer is configured within the second IC cell, or the first output metal layer is configured differently within the first IC cell than the second output metal layer is configured within the second IC cell.

13. The integrated circuit of claim 12, wherein the first intercell interconnect longitudinally extends away from the first IC cell in a first direction different than a second direction from which the third intercell interconnect longitudinally extends from the second IC cell.

14. The integrated circuit of claim 13, wherein the first input metal layer is configured differently than the second input metal layer based on the first direction being different than the second direction.

15. The integrated circuit of claim 12, wherein the second intercell interconnect longitudinally extends away from the first IC cell in a first direction different than a second direction from which the fourth intercell interconnect longitudinally extends from the second IC cell.

16. The integrated circuit of claim 15, wherein the first output metal layer is configured differently than the second output metal layer based on the first direction being different than the second direction.

17. The integrated circuit of claim 12, wherein the first and second IC cells are arranged in a same row.

18. The integrated circuit of claim 12, wherein the first and second IC cells comprise longitudinally aligned routing tracks at a metal layer M1.

19. The integrated circuit of claim 18, wherein at least one of the longitudinally aligned routing tracks include a fifth intercell metal interconnect that extends entirely through a corresponding at least one of the first and second IC cells.

20. The integrated circuit of claim 18, wherein at least one of the longitudinally aligned routing tracks is unused.

21. The integrated circuit of claim 18, wherein at least one of the longitudinally aligned routing tracks include a fifth intercell metal interconnect that terminates substantially at a metal layer inside of a corresponding one of the at least first and second IC cells.

* * * * *